United States Patent [19]

Katz et al.

[11] Patent Number: 5,818,230
[45] Date of Patent: Oct. 6, 1998

[54] NUCLEAR MAGNETIC RESONANCE PULSE SEQUENCE FOR ACQUIRING A MULTIPLE-QUANTUM FILTERED IMAGE

[75] Inventors: Jose Katz, Closter; Kwan-Jin Jung, Fort Lee, both of N.J.

[73] Assignee: The Trustees of Columbia University In The City of New York, New York, N.Y.

[21] Appl. No.: 674,755

[22] Filed: Jul. 2, 1996

[51] Int. Cl.[6] ..................................................... G01V 3/00
[52] U.S. Cl. ........................................... 324/309; 324/307
[58] Field of Search ..................................... 324/307, 309, 324/314, 312, 300

[56] References Cited

U.S. PATENT DOCUMENTS

| | | |
|---|---|---|
| 4,901,020 | 2/1990 | Ladebeck et al. . |
| 5,243,285 | 9/1993 | McKinnon et al. ...................... 324/307 |
| 5,327,086 | 7/1994 | Bodenhausen et al. ................. 324/307 |
| 5,327,087 | 7/1994 | Hafer et al. .............................. 324/307 |

OTHER PUBLICATIONS

Bansal et al., "Three Dimensional Triple Quantum Filtered $^{23}$Na Imaging of Rabbit Kidney with Weighted Signal Averaging," unpublished manuscript, 1995.

Cardiac Imaging; A Comparison to Braunwald's Heart Disease, ed. Marcus et al., Chapter 45 entitled "Use of Sodium–23 for Cardiac Magnetic Resonance Imaging and Spectroscopy," 1991, pp. 828–840 by Katz et al.

Cockman et al., "Double–Quantum–Filtered Sodium Imaging," Journal of Magnetic Resonance, vol. 90, 1990, pp. 9–18.

Hilal et al., "In vivo NMR Imaging of Tissue Sodium in the Intact Cat before and after Acute Cerebral Stroke," American Journal Nuclear Resonance, vol. 4, May–Jun. 1983, pp. 245–249.

Jung et al., "A New 2D Multiple–Quantum Technique with Position–Encoded 180° RF Pulse in Multiple–Quantum Evolution Period" Proceedings of the Society For Magnetic Resonance in Medicine and Biology, vol. 3, Aug. 19–25, 1995, p. 1929.

Jung et al., "Breakthrough of Single–Quantum Coherence and its Elimination in Double–Quantum Filtering," Journal of Magnetic Resonance, Seies B, vol. 107, 1995, pp. 235–241.

Jung et al., "Selective Acquisition of Echo and Antiecho by Using RF Phase–Cycling in Multiple–Quantum Filtering," vol. 3, Aug. 19–25, 1995, p. 1930.

Perman et al., "Methodology of in Vivo Human Sodium MR Imaging at 1.5 T[1]," Radiology, vol. 160, No. 3, Sep. 2986, pp. 811–825.

Perman et al., "Multiple Short–Echo (2.5–ms) Quantitation of in Vivo Sodium T2 Relaxation," Magnetic Resonance in Medicine, vol. 9, 1989, pp. 153–160.

Rooney et al., "Two–Dimensional Double–Quantum NMR Spectroscopy of Isolated Spin 3/2 Systems: $^{23}$Na Examples," Journal of the American Chemical Society, vol. 110, 1988, pp. 674–681.

Turski et al., "Clinical and Experimental Sodium Magnetic Resonance Imaging," Imaging in Neuroradiology, Part I, Radiology Clinics of North America, vol. 26, No. 4, Jul. 1988, pp. 861–871.

*Primary Examiner*—Louis M. Arana
*Attorney, Agent, or Firm*—Baker & Botts, L.L.P.

[57] ABSTRACT

This invention relates generally to a magnetic resonance imaging pulse sequence. More specifically, the invention relates to a phase-cycled radio frequency pulse sequence for acquiring multiple-quantum tomographic magnetic resonance data. The invention further relates to an apparatus for tomographic magnetic resonance imaging which employs a phase-cycled radio frequency pulse sequence to produce multiple-quantum tomographic magnetic resonance images.

21 Claims, 4 Drawing Sheets

NUCLEAR MAGNETIC RESONANCE PULSE SEQUENCE FOR ACQUIRING A MULTIPLE-QUANTUM FILTERED IMAGE

SPECIFICATION

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

INTRODUCTION

This invention relates to a magnetic resonance imaging pulse sequence, and more particularly to an optimized phase-cycled pulse sequence for acquiring multiple-quantum magnetic resonance image data. This invention further relates to a magnetic resonance imaging device for generating a multiple-quantum tomographic image of a sample.

BACKGROUND OF THE INVENTION

Nuclear magnetic resonance imaging, which is commonly known as magnetic resonance imaging ("MRI"), has been known and used as a non-invasive, non-ionizing diagnostic tool by physicians for some time. MRI may be used to obtain a three-dimensional image of a sample. This image may be reconstructed to show an image of any two-dimensional slice of the sample.

Conventional magnetic resonance imaging produces diagnostic images by measuring a single-quantum transition of hydrogen ($^1$H) nuclei, which are present in abundance in the body, have a net nuclear spin, and produce a relatively strong magnetic resonance signal. These images are generated by first exposing the body to a uniform magnetic field which causes hydrogen nuclei within the body to align with the magnetic field. The hydrogen nuclei have a magnetic field vector which actually precesses around the vector associated with the uniform magnetic field at a frequency known as the Larmor frequency. This frequency varies for different nuclei and with magnetic field strength. Next, a series of radio frequency pulses is applied to the body, which causes the hydrogen nuclei to shift out of alignment with the magnetic field. Various magnetic gradient pulses are also typically applied parallel to the magnetic field and along the two other orthogonal three-dimensional coordinate directions. These magnetic gradient pulses have the effect of spatially encoding the detected radio frequency signal so that it may be associated with a particular pixel within the body. The magnetic resonance signal is then detected by measuring an inductive current which is produced in a readout coil when the hydrogen nuclei change alignment within the uniform magnetic field. Magnetic resonance images obtained according to this method produce diagnostic images of the body's internal structure. However, these images yield little information regarding the chemical environment of localized regions within the body.

Physicians and physicists have therefore sought improved magnetic resonance imaging methods which might yield information about the chemical environment of a localized region within the body in addition to structural information. With this goal, physicians and physicists have investigated performing magnetic resonance imaging by selecting atomic nuclei other than hydrogen, which might hopefully yield more data regarding their chemical environment. Specifically, physicians and physicists have experimented with detecting signals from other lower-sensitivity nuclei present in lower abundance in the body, such as $Na^{23}$. These experiments have employed techniques for detecting multiple-quantum transitions of such nuclei, which may yield selective information about the chemical environment surrounding the particular nuclei in a region of the body. Numerous experiments have focused on obtaining tomographic magnetic resonance images of $Na^{23}$ because abnormal concentrations of sodium in certain regions of the body may signal specific medical problems.

It has been difficult to obtain high quality tomographic data produced from multiple-quantum transitions of low sensitivity, low abundance nuclei because the signal-to-noise ratio becomes unacceptably low. It is very important for an MRI instrument or technique to have a high signal-to-noise ratio which enables collection of a tomographic image of a patient in a time interval which is acceptable for the patient and is economically feasible in relation to the cost of an MRI machine.

Therefore, a need clearly exists for a successful method for generating multiple-quantum tomographic magnetic resonance images having a high signal-to-noise ratio, from low-sensitivity nuclei.

SUMMARY OF THE INVENTION

The deficiencies of the prior art are substantially ameliorated in accordance with the present invention, which is, in one aspect, an optimized magnetic resonance imaging method for obtaining high signal-to-noise ratio multiple-quantum magnetic resonance data.

In one aspect, this invention relates to an optimized method and apparatus for acquiring tomographic magnetic resonance data from a sample. The sample may be a human being. In this optimized method, a sample is first exposed to a uniform magnetic field applied along an arbitrary slice-selection axis, which causes nuclei to align with the slice-selection axis. Next, a sequence of phase-cycled radio frequency pulses is applied to the sample, which causes the selected nuclei to shift out of alignment with the magnetic field. "Phase-cycling" means shifting the phase angle of each successive radio frequency pulse in the pulse sequence according to a particular pattern. Each phase-cycled radio frequency pulse of the sequence has a flip angle relative to the slice-selection axis and a phase angle relative to an axis perpendicular to the slice-selection axis. In the present invention, the phase angles of the radio frequency pulses are cycled according to a particular pattern which achieves simultaneous detection of both the echo and antiecho component signals of a selected multiple-quantum coherence of the selected nuclei. These radio frequency pulses are preferably tuned to a frequency which is substantially equal to the Larmor frequency of the selected nuclei. In a more preferred embodiment of the invention, the radio frequency pulse sequence also has a phase-cycled 180° flip angle refocusing pulse which is applied during the evolution period of the pulse sequence. During the evolution period, the selected nuclei exhibit multiple-quantum coherence. A phase-cycled radio frequency pulse sequence having a 180° flip angle refocusing pulse during the evolution period is described in "A New 2D Multiple-Quantum Technique with Position-Encoded 180° RF Pulse in Multiple-Quantum Evolution Period," Jung et al., *Proc. Soc. Magnetic Resonance*, Vol. 3, p. 1929, Aug. 19–25, 1995, which is incorporated herein by reference.

Magnetic gradient pulses are also applied to the sample in time-wise coordination with the radio frequency pulse sequence. These magnetic gradient pulses encode positional information into the detected signal. The detected signal is a single-quantum signal having an amplitude proportional to the sum of the echo and anti-echo multiple-quantum signals. The detected signal is obtained by measuring an inductive current produced in a radio frequency coil. This process is repeated numerous times to produce an image.

The method of the invention achieves a high signal-to-noise ratio because the phase-cycled radio frequency pulse sequence of the invention simultaneously detects the sum of both the echo and antiecho signals of the selected multiple-quantum coherence. A phase-cycled radio frequency pulse sequence which simultaneously selects the sum of both the echo and antiecho multiple-quantum transitions is described in "Selective Acquisition of Echo and Antiecho by Using RF Phase-Cycling in Multiple-Quantum Filtering," Jung et al., *Proc. Soc. Magnetic Resonance*, Vol. 3, p. 1930, Aug. 19–25, 1995, which is incorporated herein by reference. Therefore, the detected signal amplitude is higher than that which may be obtained using conventional methods, which are only capable of measuring either the echo or the antiecho signal during a single pulse sequence.

Conventional multiple-quantum transition filtering methods, which rely on magnetic gradient pulses to implement a multiple-quantum filter, are also disadvantageous because they suffer from amplitude deterioration caused by multiple-quantum relaxation during the evolution period. In contrast, the method according to the invention uses magnetic gradient pulses solely to encode positional information in the detected signal, but does not use such magnetic gradient pulses to implement a multiple-quantum filter. Therefore, the present method does not suffer from such signal amplitude deterioration effects which are problematic for conventional methods.

A preferred method according to the invention is further superior to conventional methods because it includes a phase-cycled 180° flip angle refocusing radio frequency pulse during the evolution period. This evolution period refocusing pulse further improves the signal-to-noise ratio because it prevents magnetic field inhomogeneities from causing signal amplitude deterioration during the evolution period.

In another aspect of the present invention, there is provided a magnetic resonance imaging device having a computer programmed to implement the above-described radio frequency and magnetic gradient pulse sequences.

These, and other features, aspects and advantages of the present invention will become better understood with reference to the following description of the invention, the claims, and accompanying drawings.

DETAILED DESCRIPTION OF THE PREFERRED EMBODIMENTS

Figure 1:
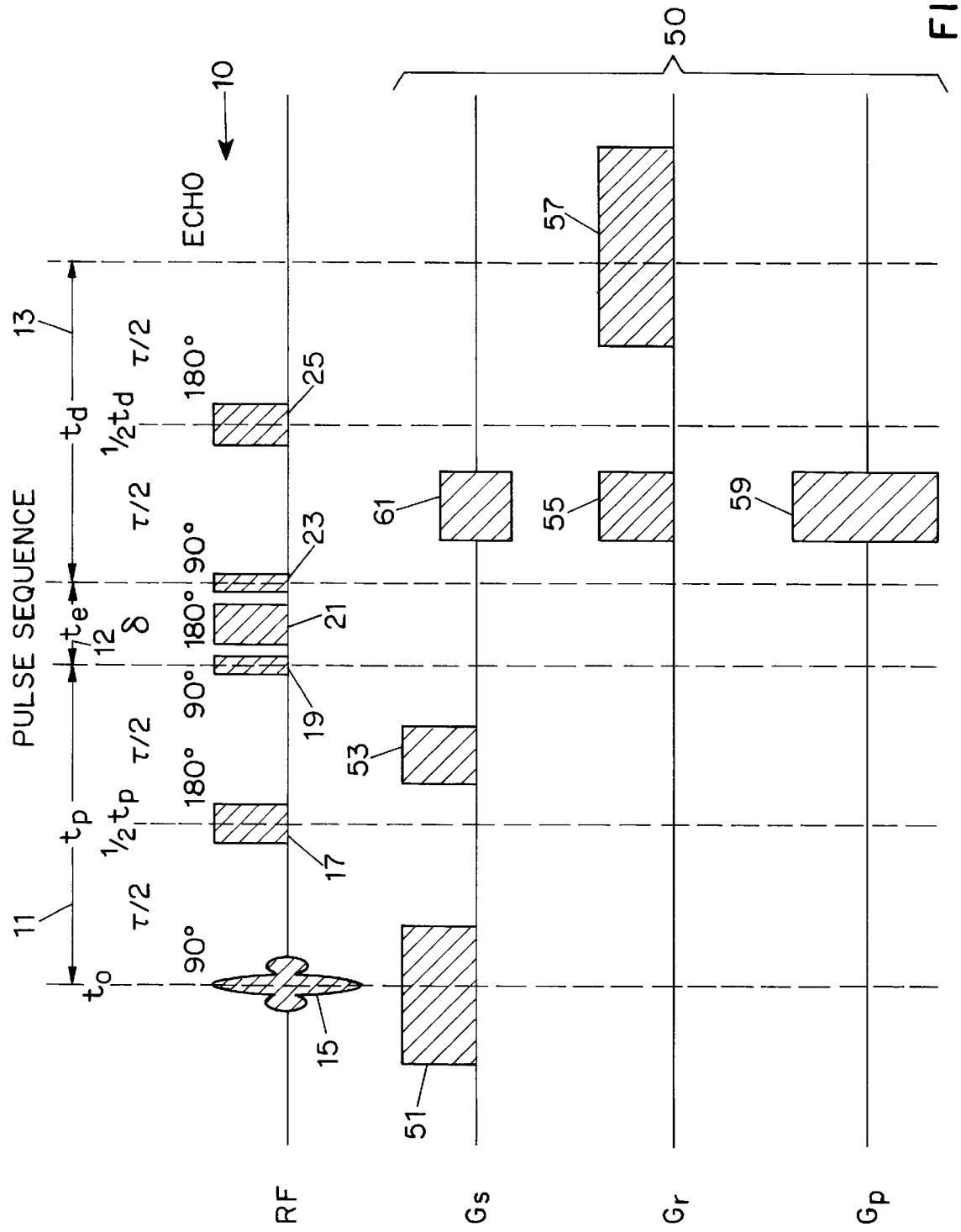
FIG. 1 illustrates a series of radio frequency pulses and a synchronized series of magnetic gradient pulses according to an embodiment of the invention which includes a phase-cycled evolution period 180° flip angle refocusing pulse.

The present invention provides a method and apparatus for generating multiple-quantum tomographic magnetic resonance images having high signal-to-noise ratios.

The present invention is based, in part, on the finding that a multiple-quantum tomographic magnetic resonance image having a superior signal-to-noise ratio may be obtained using a phase-cycled radio frequency pulse sequence. Specifically, the invention is, in part, based on the finding that such a phase-cycled radio frequency pulse sequence may be used to implement a multiple-quantum filter while avoiding any disadvantageous signal deterioration. The invention is further based on the finding that the phase-cycled radio frequency pulse sequence according to the invention may be used to simultaneously select both the echo and antiecho signals of a particular multiple-quantum coherence, thereby producing a larger output signal which is proportional to the sum of the amplitudes of both the echo and antiecho multiple-quantum signals. Finally, the invention is further based on the finding that the phase-cycled evolution period 180° flip angle radio frequency pulse may be optionally included in the pulse sequence to prevent any signal amplitude deterioration during the evolution time of the pulse sequence due to magnetic field inhomogeneity over the sample.

In a first exemplary embodiment of the invention, a method for acquiring tomographic magnetic resonance data from a sample is provided. In this method, a uniform magnetic field is applied along a slice-selection axis of a sample. The uniform magnetic field causes the nuclei within the sample to align in the magnetic field such that they precess around the slice-selection axis.

A phase-cycled radio frequency pulse sequence is then applied to the sample. The radio frequency pulse sequence comprises radio frequency pulses tuned to the Larmor frequency of the selected nuclei. It is preferable to select nuclei having a net nuclear spin which are capable of undergoing multiple-quantum spin transitions. It is also possible, however, to utilize the invention to detect multiple-quantum transitions in coupled systems of nuclei which are separately incapable of undergoing multiple-quantum transitions (e.g., coupled hydrogen nuclei). Each radio frequency pulse has a flip angle relative to the slice-selection axis and a phase angle relative to an axis which is perpendicular to the slice-selection axis. The phase angles of the individual radio frequency pulses are cycled according to a relationship which implements a multiple-quantum transition filter and simultaneously produces an output signal proportional to the sum of the echo and antiecho signals of the selected multiple-quantum coherence. The radio frequency pulse sequence further comprises an evolution period 180° flip angle refocusing pulse. This pulse prevents any signal deterioration during the evolution period, which may be caused by magnetic field inhomogeneity over the sample.

A magnetic gradient pulse sequence is also applied to the sample in timewise coordination with the radio frequency pulse sequence. This magnetic gradient pulse sequence does not function to implement a multiple-quantum filter. Instead, the magnetic gradient pulse sequence encodes positional information in the output signal. This magnetic gradient pulse sequence may enable reconstruction of a two-dimensional image, or of a three-dimensional tomographic image.

An output signal is then detected by measuring an inductive current produced in the radio-frequency coil as the selected nuclei realign in the magnetic field. A most preferred use of the invention is studying tomographic images of animals (e.g., humans) generated by detecting multiple-quantum transitions of $^{23}$Na.

The radio frequency pulse sequence preferably has, in sequence, a preparation period of length $t_p$ extending from time zero $t_o$, an evolution period of length $t_e$ and a detection period of length $t_d$. The radio frequency pulse sequence manipulates the selected nuclei such that, during the preparation period, the selected nuclei exhibit single-quantum coherence. During the evolution period, the pulse sequence implements a multiple-quantum filter which isolates a particular multiple-quantum coherence (e.g., double or triple) and simultaneously selects both the echo and the antiecho signals corresponding to the multiple-quantum coherence. The selected nuclei exhibit single-quantum coherence during the detection period. The output signal, which is observed during the detection period, is a single-quantum coherence signal. The output signal is produced as the magnetic fields of the selected nuclei realign within the uniform magnetic field. This signal is preferably detected by measuring an inductive current produced in a radio frequency coil during the realignment process.

The radio frequency pulse sequence preferably includes an evolution period which comprises an evolution period first 90° flip angle radio frequency pulse timewise centered at $t_p$. This pulse converts the selected nuclei from single-quantum coherence to multiple-quantum coherence. The evolution period according to the first exemplary embodiment also has an evolution period 180° flip angle refocusing pulse, which is timewise centered at $t_p+t_e$. This refocusing pulse prevents signal amplitude deterioration due to magnetic field inhomogeneity over the sample. Finally, the pulse sequence further includes an evolution period second 90° flip angle radio frequency pulse timewise centered at $t_p+t_e$. This second 90° flip angle pulse converts the selected nuclei back to single-quantum coherence.

In a more preferred aspect of this first exemplary embodiment of the invention, the evolution period first 90° flip angle radio frequency pulse has a phase angle of $\phi_3$, the evolution period 180° flip angle refocusing pulse has a phase angle $\phi_4$ and the evolution period second 90° flip angle radio frequency pulse has a phase angle $\phi_5$. In this embodiment, the phase angles of these evolution period radio frequency pulses are related according to the following equation:

$$\phi_E=\phi_3-2\phi_4+\phi_5$$

wherein $\phi_E$ represents the collective radio frequency phases of the pulses during the evolution time.

In an even more preferred exemplary embodiment of the invention, the radio frequency pulse sequence further comprises a preparation period 90° flip angle radio frequency slice-selecting pulse, a preparation period 180° flip angle radio frequency refocusing pulse, and a detection period 180° flip angle radio frequency refocusing pulse. These pulses are timewise centered at $t_o$, ½ $t_p$ and $t_p+t_e+$ ½$t_d$, respectively. The preparation period 90° flip angle radio frequency pulse selects a slab of the sample perpendicular to the slice-selection axis. The preparation period 180° flip angle radio frequency pulse and the detection period 180° flip angle radio refocusing pulse both prevent deterioration of the output signal due to magnetic field inhomogeneity over the sample. In this respect, these pulses are analogous to refocusing pulses used in conventional spin-echo magnetic resonance imaging. FIG. 1 depicts a radio frequency pulse sequence according to the first exemplary embodiment of the invention.

In a most preferred version of the first exemplary embodiment of the invention, the preparation period 90° flip angle radio frequency slice-selection pulse has a phase angle $\phi_1$, the preparation period 180° radio frequency refocusing pulse has a phase angle $\phi_2$ and the detection period 180° flip angle radio frequency pulse has a phase angle $\phi_6$. In this embodiment, the collective phases $\phi_p$ of the radio frequency pulses during the preparation time (including the phase $\phi_3$ of the evolution period first 90° flip angle radio frequency pulse), are governed by the following equation:

$$\phi_p=\phi_1-2\phi_2+\phi_3$$

The phase of the output signal, $\Phi$, is given by the following equation:

$$\Phi=\phi_p-m\phi_E+\phi_5+2\phi_6+\phi_R,$$

wherein $\phi_R$=the phase of the receiver, $\Phi$=the phase of the detected signal, and m=an integer corresponding to the selected multiple-quantum transition.

Double-quantum filtered images are produced when m=±2, and triple-quantum filtered images are produced when m=±3.

In a specific instance of this most preferred exemplary embodiment of the invention, a double-quantum filtered image is produced using a pulse sequence wherein:

$\phi_1=(n/2)\pi,$ $\phi_2=[n/2+\text{int }(n/4)]\pi,$ $\phi_3=(n/2)\pi,$ $\phi_4=0,$ $\phi_5=0,$ $\phi_6=0,$ and $\phi_R=n\pi,$ where int(n/4) represents the integer part of the variable n/4. The variable n is a positive integer which varies between 0 and N−1 where N is a multiple of 8. These phase angles are given in radians.

In another specific instance of this most preferred exemplary embodiment of the invention, a triple-quantum filtered image is produced using a pulse sequence wherein:

$\phi_1=(n/3)\pi,$ $\phi_2=[n/3+\text{int}(n/6)]\pi,$ $\phi_3=(n/3+½)\pi,$ $\phi_4=0,$ $\phi_5=(⅙)\pi,$ $\phi_6=0,$ and $\phi_R=[n+\text{int}(n/6)]\pi,$ where int(n/6) represents the integer part of the variable n/6. The variable n is a positive integer which varies between 0 and N−1 where N is a multiple of 12. These phase angles are given in radians.

Figure 2:
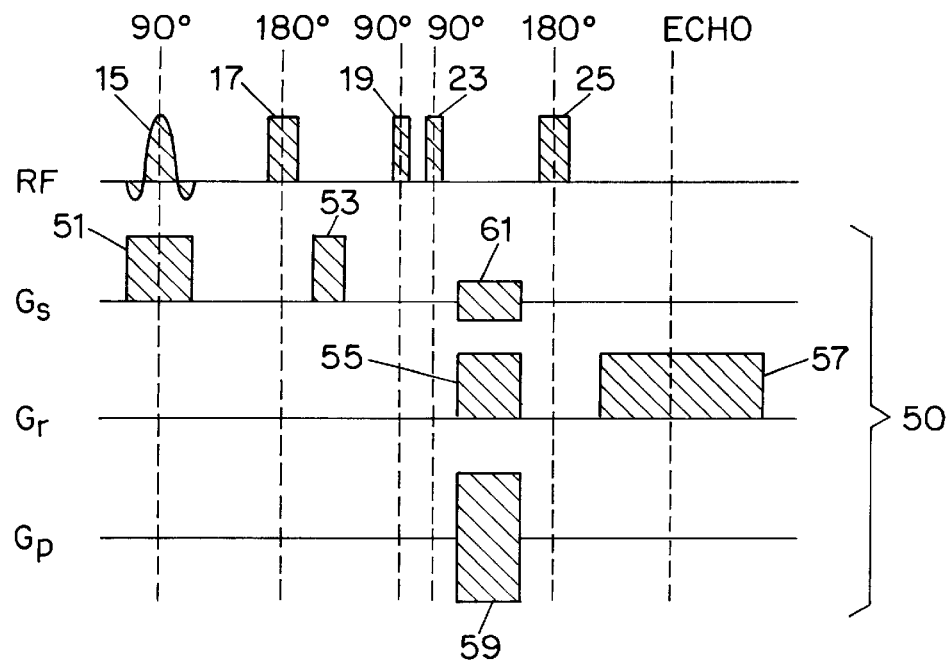
FIG. 2 illustrates a series of radio frequency pulses and a synchronized series of magnetic gradient pulses according to an embodiment of the invention which does not include an evolution period 180° flip angle refocusing pulse.

In a second, less preferred exemplary embodiment of the invention, the radio frequency pulse sequence is similar to the first exemplary embodiment with the exception that it does not include an evolution period 180° flip angle refocusing pulse. Therefore, this second embodiment of the invention is a radio frequency pulse sequence having a non-refocused evolution time. FIG. 2 depicts a radio frequency pulse sequence according to this second, less preferred exemplary embodiment of the invention.

A magnetic gradient pulse sequence is also preferably applied to the sample in synchrony with the radio frequency pulse sequence. This magnetic gradient pulse sequence comprises several magnetic gradient pulses which encode positional information in the magnetic resonance data. Specifically, a two-dimensional magnetic pulse sequence according to a particular embodiment of the invention comprises, in order, a slice selection magnetic gradient pulse, a slice selection compensation magnetic gradient pulse, a first phase-encoding magnetic gradient pulse, a readout compensation magnetic gradient pulse, and a readout magnetic gradient pulse. If three-dimensional tomographic data is desired, a second phase-encoding magnetic gradient pulse must be further included in the sequence.

In an exemplary embodiment of the magnetic gradient pulse sequence, the slice-selection magnetic gradient pulse is applied along the direction of the slice-selection axis. This pulse is applied for a length of time which at least overlaps with the preparation period 90° flip angle slice selection radio frequency pulse.

Next, a slice-selection compensation magnetic gradient pulse is applied along the same slice-selection axis. This pulse is applied after the preparation period 180° flip angle radio frequency refocusing pulse and before the evolution period first 90° flip angle radio frequency pulse. The total area of this magnetic gradient pulse which may also be expressed as the time/amplitude product, is equal to the area of the slice-selection magnetic gradient pulse excluding any area of said slice-section magnetic pulse before $t_o$.

After the slice-selection compensation pulse, a first phase-encoding magnetic gradient pulse is applied along a phase-encoding coordinate axis which is orthogonal in three-dimensional space to both the slice-selection and the readout axis. This axis is known as the phase-encoding axis. The first phase-encoding pulse is applied after the evolution period second 90° flip angle radio frequency pulse and before the detection period 180° flip angle radio frequency refocusing pulse. A readout compensation magnetic gradient pulse is simultaneously applied along the readout axis.

If three-dimensional tomographic data is desired, a second phase-encoding magnetic gradient pulse is also applied along the slice-selection axis in synchrony with the first phase-encoding magnetic gradient pulse. If this pulse is absent, two-dimensional data will be obtained.

Finally, a readout magnetic gradient pulse is applied along the readout axis after the detection period 180° flip angle radio frequency refocusing pulse. This readout magnetic gradient pulse is applied during the time when the output signal is observed. This pulse has an area before time $t_p + t_e + t_d$ which is equal to the area of the readout compensation magnetic gradient pulse.

FIG. 1 depicts a representation of the first exemplary embodiment of a preferred radio frequency pulse sequence 10, and a preferred magnetic gradient pulse sequence 50 according to the invention. The phase-cycled radio frequency pulse sequence 10 has a preparation period 11, an evolution period 12 and a detection period 13. The series of radio frequency pulses 10 also has an evolution period 180° flip angle radio frequency refocusing pulse 21 during the evolution period 12. The series of phase-cycled radio frequency pulses 10 implements a multiple-quantum filter and simultaneously selects both the echo and anti-echo components of the multiple-quantum signal. The phase-cycle radio frequency pulse sequence 10 also avoids signal amplitude deterioration due to multiple-quantum relaxation during the evolution period. In order to generate a tomographic image, the multiple-quantum signal is preferably encoded with positional information via a series of magnetic gradient pulses 50.

The phase-cycled radio frequency pulse sequence 10 has, in sequence, a) a preparation period 90° flip angle radio frequency slice-selection pulse 15, b) a preparation period 180° flip angle radio frequency refocusing pulse 17, c) an evolution period first 90° flip angle radio frequency pulse 19, d) an evolution period 180° flip angle radio frequency refocusing pulse 21, e) an evolution period second 90° flip angle radio frequency pulse 23, and f) a detection period 180° flip angle radio frequency refocussing pulse 25.

The magnetic gradient pulse 50 sequence shown in FIG. 1 comprises a) a slice-selection magnetic gradient pulse 51, b) a slice-selection compensation magnetic gradient pulse 53, c) a first phase-encoding magnetic gradient pulse 59, d) a second phase-encoding magnetic gradient pulse 61, e) a readout compensation magnetic gradient pulse 55, and f) a readout magnetic gradient pulse 57.

In FIG. 1, the axis $G_s$ is the slice-selection axis, $G_r$ is the readout axis and $G_p$ is the phase-encoding axis. The slice-selection magnetic gradient pulse 51, the slice-selection compensation 53 pulse and the second phase-encoding magnetic gradient pulse 61 are applied along the slice-selection axis. The readout magnetic gradient pulse 57 and readout compensation magnetic gradient 55 pulse are applied along the readout axis. The first phase-encoding magnetic gradient pulse 59 is applied along the phase-encoding axis. Both the phase-encoding and the readout axes are orthogonal to each other, and to the slice-selection axis.

FIG. 2 depicts a representation of the second, less preferred exemplary embodiment of the invention. As shown in FIG. 2, the second, less preferred, exemplary embodiment of the invention differs from the first exemplary embodiment solely because it lacks an evolution period 180° refocusing radio frequency pulse.

Figure 3:
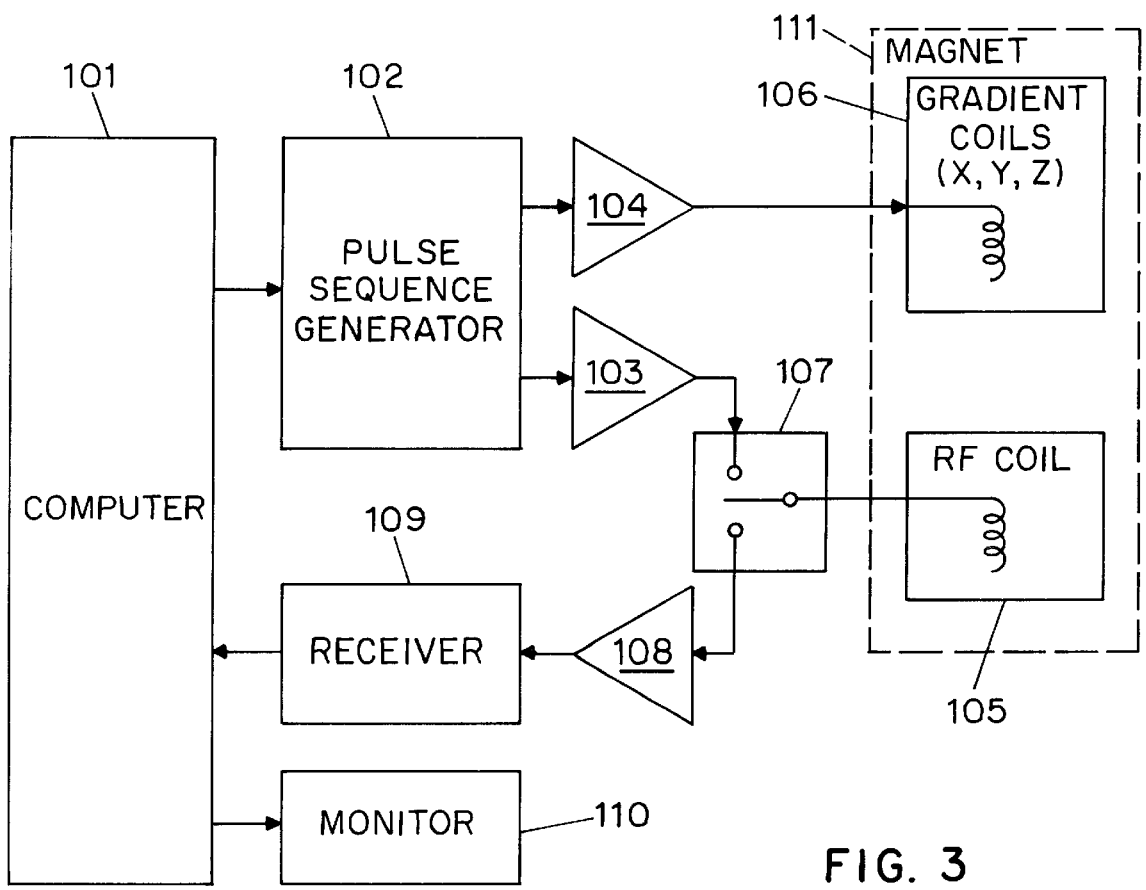
FIG. 3 is a diagrammatic representation of a magnetic resonance imaging apparatus according to an embodiment of the invention.

FIG. 3 depicts a diagrammatic representation of a typical MRI imaging system capable of performing the imaging method according to the present invention. In FIG. 3, the magnet 111 is installed with the magnetic gradient coils 106 and the radio frequency coil 105. The magnetic gradient coils 106 are positioned to apply magnetic gradient pulses to a sample along three orthogonal directions. A radio frequency coil 105 is also provided. The radio frequency coil 105 must be capable of applying a series of radio frequency pulses having particular flip angles and phase angles. The magnetic gradient coils 106 and the radio frequency coil 105 are both operably connected to a pulse sequence generator 102 via a gradient amplifier 104 and a radio frequency amplifier 103, respectively. A switch 107 is located between the radio frequency coil 105 and the radio frequency amplifier 103. The switch 107 also provides an alternate path from the radio frequency coil 105 through the output amplifier 108 which leads to a receiver 109. This alternate path is used to detect the output signal which is a current induced in the radio frequency coil 105. The receiver 109 and the pulse sequence generator 102 are both interfaced with a computer 101 which is programmed to produce a radio frequency pulse sequence according to the invention. The computer 101 is also interfaced with a monitor 110 which may display a desired slice of the imaged sample.

It should be noted that the above-described exemplary embodiments are merely intended to illustrate the invention, and therefore the invention should not be limited to these embodiments. One skilled in the art could easily modify the above-described magnetic resonance imaging method while not altering the spirit or scope of the claimed invention. For example, one skilled in the art would find it trivial to alter the magnetic pulse sequence to produce two or three-dimensional images of a sample by removing or adding the second phase-encoding magnetic gradient pulse, respectively. One skilled in the art could also modify the phase-cycled radio frequency pulse sequence while maintaining selection of a multiple-quantum echo and antiecho signal. Such modifications would fall within the scope of the present invention.

The present invention is further described by way of the following examples. These examples are intended to be representative of the invention and are not in any way intended to limit its scope.

EXAMPLE 1

Multiple-Quantum $Na^{23}$ Magnetic Resonance Imaging

Triple-quantum magnetic resonance imaging was performed in a manner similar to the first exemplary embodiment of the invention using the phase-cycled radio frequency pulse sequence described below in Table I. However, two-dimensional magnetic resonance data was obtained in this example.

TABLE I

| Flip Angle | Phase Angle |
|---|---|
| 90° | $\phi_1 = 0°$ |
| 180° | $\phi_2 = 90°$ |
| 90° | $\phi_3 = 90°$ |
| 180° | $\phi_4 = n\,(30°)*$ |
| 90° | $\phi_5 = 30°$ |
| 180° | $\phi_6 = 0°$ |
| Receiver | $\phi_R = 0°, 180°$ |

*Here n = 0 to 11, and the sequence was repeated in multiples of 12.

Figure 4:
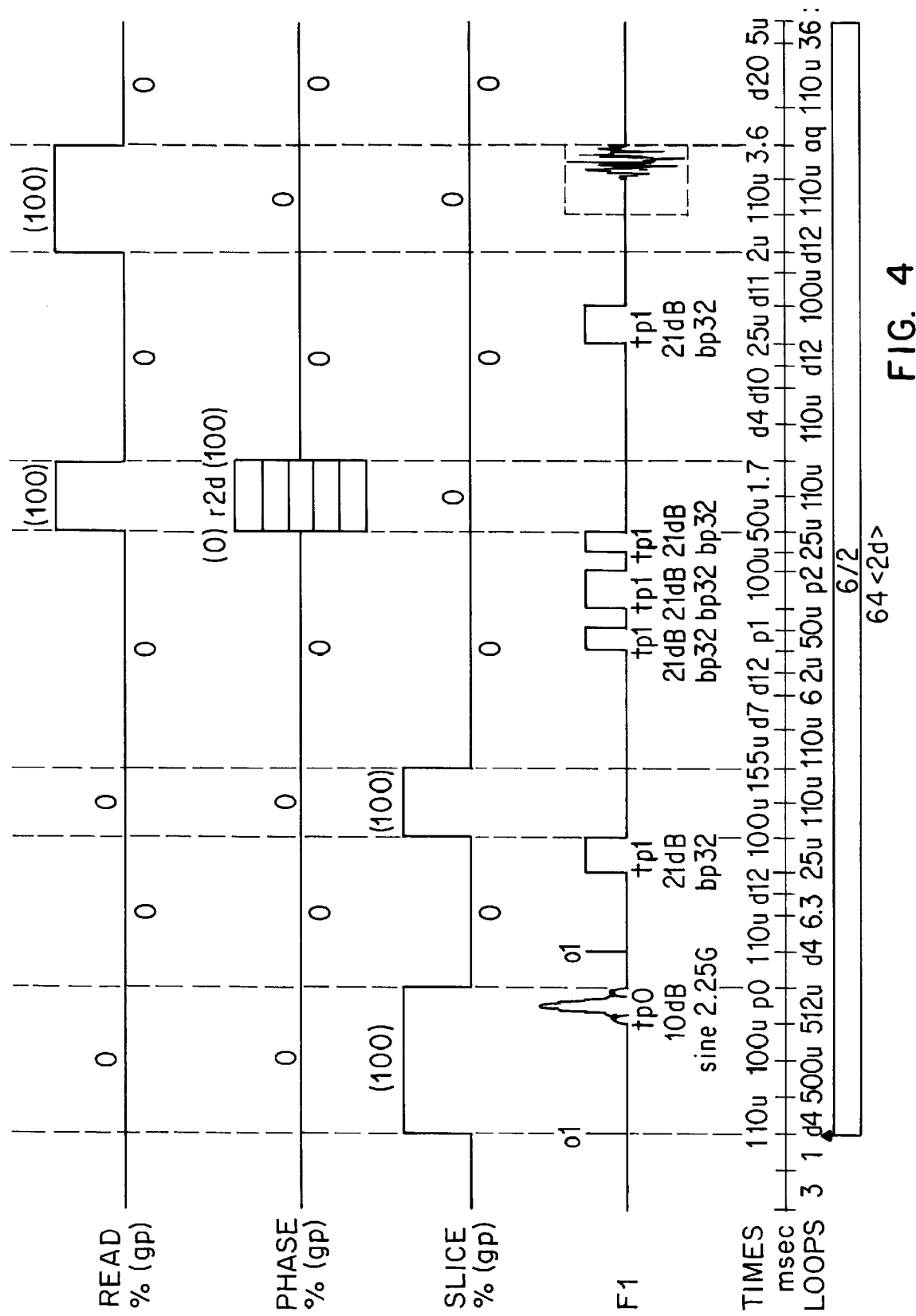
FIG. 4 illustrates a series of radio frequency pulses and a synchronized series of magnetic gradient pulses produced by the experiment of Example 1.

A Bruker "BIOSPEC 47/40" Magnetic Resonance Imaging device was used during these experiments. This system has a magnetic field of 4.7 Tesla, which produces a Larmor frequency of 53.06 MHZ for $Na^{23}$. This system is a horizontal imaging system with a bore size of 40 cm. The RF coil is of the non-quadrature, slotted resonator type rather than the bird cage type. FIG. 4 depicts the radio frequency and magnetic gradient pulse sequences utilized in this experiment. These sequences were generated using the attached programs A and C.

It was determined that the optimum creation time was 14 milliseconds. No single-quantum breakthrough was observed when multiple-quantum filtering was implemented using the phase-cycled pulse sequence.

A rat brain was imaged according to this method. It was determined that 10 milliseconds was the optimum time for rat brain imaging.

EXAMPLE 2

Distinguishing $Na^{23}$ Based On Chemical Environment

Seven 0.5-inch diameter vials filled with aqueous solutions containing the following ingredients:

TABLE II

| Vial | (mM) NaCl | % Agarose |
|---|---|---|
| 1 | 80 | 0 |
| 2 | 80 | 4 |
| 3 | 60 | 4 |
| 4 | 40 | 4 |
| 5 | 20 | 4 |
| 6 | 10 | 4 |
| 7 | 5 | 4 |

Figure 5A:
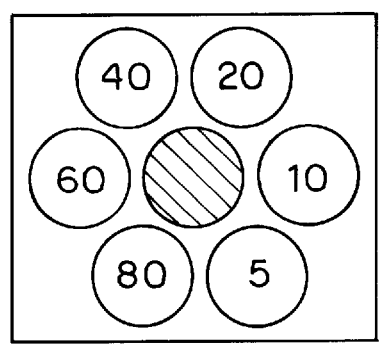
FIGS. 5(a), 5(b) and 5(c) depict the arrangement of vials used in example 2, a single-quantum magnetic resonance image obtained of the vials, and a triple-quantum magnetic resonance image obtained of the vials, respectively.
Figure 5B:
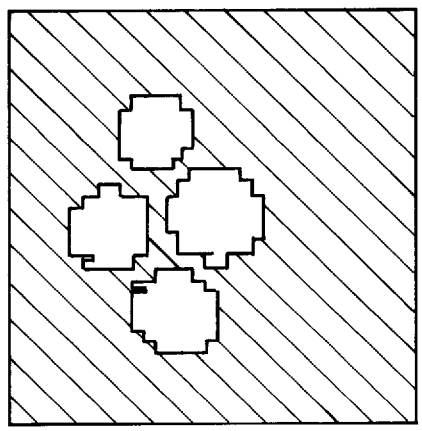
Figure 5C:
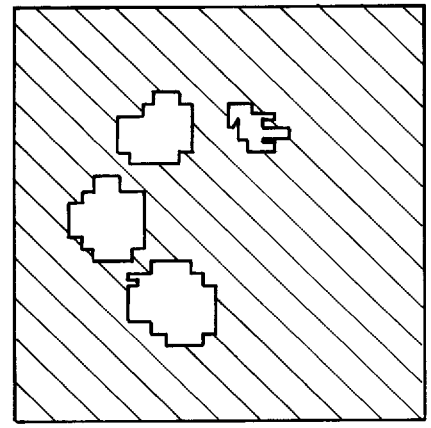

FIGS. 5(*a*), 5(*b*) and 5(*c*) show the arrangement of the seven vials, and single and triple-quantum two-dimensional magnetic resonance images obtained by imaging the vials using a single-quantum imaging method and the imaging method described in Example 1, respectively. A comparison of these images shows that the triple-quantum imaging method successfully distinguished between free sodium (vial 1), which does not register in the triple-quantum image, and sodium interacting with agarose which registers strongly in the triple-quantum image (vial 2).

COMPUTER PROGRAMS

The following computer program listings A and C were used in Examples 1 and 2 to operate the "BIOSPEC 47/40" magnetic resonance imaging system. Computer program listing B shows a program for generating a phase-cycled radio frequency pulse sequence which lacks a 180° refocusing pulse during the evolution period. The attached computer programs are as follows:

A. Pulse program for a refocused evolution period,

B. Pulse program for a non-refocused evolution period, and

C. Program to calculate the time variables for the pulse programs A and B.

A30470-50/33176

© 1995 Kwan-Jin Jung

Pulse Program for Triple Quantum Filter Acquisition
Using Refocused Evolution Period

```
start,     3.0m                 rg            tlo
           if (ACQ_trigger_enable)   {
               10u:u2            trign                ; trigger on ?
               d7                                     ; trigger delay
           }
slice,     1.0m
           d4:ngrad             o1                    ;#1 slice on
           0.9m                                       ; stabilization delay
           0.1m:u1:u10                                ; amp delay
           p0:tp0:u1:u10                      ph1     ;RF - 90 degree pulse
           d4:ngrad                                   ;#2 all gradients off
           d5                   o1                    ; balance delay 1
           d12                                        ; variable time delay
           d8:u1:u10                                  ; amp delay
           p2:tp1:u1:u10                      ph2     ;RF - 1st 180 degree pulse
           d4:ngrad                                   ;#3 slice compensation
           d6                                         ; slice trim duration
           d4:ngrad                                   ;#4 all gradients off
           d7                                         ; balance delay 2
           d12                                        ; variable time delay
           d8:u1:u10                                  ; amp delay
           p1:tp1:u1:u10                      ph3     ;RF - 2nd 90 degree pulse
           d14:u1:u10                                 ; variable amp delay
           p2:tp1:u1:u10                      ph4     ;RF - 2nd 180 degree pulse
           d14:u1:u10                                 ; variable amp delay
           p1:tp1:u1:u10                      ph5     ;RF - 3rd 90 degree pulse
           d4:ngrad                                   ;#5 read comp, phase on
           d9                                         ; phase grad delay
           d4:ngrad                                   ;#6 all gradients off
           d10                                        ; balance delay 3
           d12                                        ; variable time delay
           d8:u1:u10                                  ; amp delay
           p2:tp1:u1:u10                      ph6     ;RF - 3rd 180 degree pulse
           d11                                        ; balance delay 4
           d12                                        ; variable time delay
           d4:ngrad                           ph7     ;#7 read on
           d4                   recon                 ;read stabilization delay
           aq                   stadc         ph8     ; use PAPS = AV
           d4:ngrad             recoff                ;#8 all gradients off
           d20                  ipp4                  ;repetition delay
           lo to start times NA
           5u                   rpp4
           goto start
exit ph1 = 0
ph2 = (360) 270
ph3 = (360) 90
ph4 = (360) 0 30 60 90 120 150 180 210 240 270 300 330
ph5 = (360) 30
ph6 = 0
ph7 = 0
ph8 = 0 2
```

- 23 -

© 1995 Kwan-Jin Jung

Pulse Program for Triple Quantum Filter Acquisition
Using Nonrefocused Evolution Period

```
start,      3.0m              rg           tlo
            if (ACQ_trigger_enable)  {
                10u:u2        trign                 ; trigger on ?
                d7                                  ; trigger delay
            }
slice,      1.0m
            d4:ngrad          o1                    ;#1 slice on
            0.9m                                    ; stabilization delay
            0.1m:u1:u10                             ; amp delay
            p0:tp0:u1:u10                  ph1      ;RF - 90 degree pulse
            d4:ngrad                                ;#2 all gradients off
            d5                o1                    ; balance delay 1
            d12                                     ; variable time delay
            d8:u1:u10                               ; amp delay
            p2:tp1:u1:u10                  ph2      ;RF - 1st 180 degree pulse
            d4:ngrad                                ;#3 slice compensation
            d6                                      ; slice trim duration
            d4:ngrad                                ;#4 all gradients off
            d7                                      ; balance delay 2
            d12                                     ; variable time delay
            d8:u1:u10                               ; amp delay
            p1:tp1:u1:u10                  ph3      ;RF - 2nd 90 degree pulse
            d14:u1:u10                              ; variable amp delay
            ;p2:tp1:u1:u10                 ph4      ;RF - 2nd 180 degree pulse
            ;d14:u1:u10                             ; variable amp delay
            p1:tp1:u1:u10                  ph5      ;RF - 3rd 90 degree pulse
            d4:ngrad                                ;#5 read comp, phase on
            d9                                      ; phase grad delay
            d4:ngrad                                ;#6 all gradients off
            d10                                     ; balance delay 3
            d12                                     ; variable time delay
            d8:u1:u10                               ; amp delay
            p2:tp1:u1:u10                  ph6      ;RF - 3rd 180 degree pulse
            d11                                     ; balance delay 4
            d12                                     ; variable time delay
            d4:ngrad                       ph7      ;#7 read on
            d4                recon                 ;read stabilization delay
            aq                stadc        ph8      ; use PAPS = AV
            d4:ngrad          recoff                ;#8 all gradients off
            d20               ipp4                  ;repetition delay
            lo to start times NA
            5u                rpp4
            goto start
exit ph1 = (360) 0 60 120 180 240 300
ph2 = (360) 270 330 30 90 150 210
ph3 = (360) 90 150 210 270 330 30
ph4 = (360) 0 30 60 90 120 150 180 210 240 270 300 330
ph5 = (360) 30
ph6 = 0
ph7 = 0
ph8 = 0 2
```

© 1995 Kwan-Jin Jung

PROGRAM TO CALCULATE THE TIME VARIABLES

```
#include       "userinc.h"

void InitMQF()
{
/*------------------------------------------------------------*
 * Last Modified:
 *------------------------------------------------------------*/
  strcpy(PULPROG, "mqf.ppg");
  strcpy(GRDPROG, "mqf");
  strcpy(ACQ_trim_file, "calculated");
  ACQ_n_trim = 1;
  PARX_call_rels("ACQ_n_trim");
  PARX_hide_pars(NOT_HIDDEN,"IMND_pulse_length,IMND_refocus_length");
  PARX_hide_pars(NOT_HIDDEN,"IMND_slice_length,IMND_imag_shape_enum");
  PARX_hide_pars(NOT_HIDDEN,"IMND_variable_time,IMND_total_time");
  PARX_hide_pars(NOT_HIDDEN,"IMND_evolution_time,IMND_creation_time");
  PARX_hide_pars(NOT_HIDDEN,"IMND_rep_time");
  PARX_hide_pars(HIDE_ALWAYS,"IMND_recov_time");
  PARX_hide_pars(HIDE_ALWAYS,echo_pars);
  PARX_noedit(TRUE,"IMND_n_slices");
  IMND_n_slices = 1;
  IMND_n_echoes = IMND_n_echo_images = IMND_echo_scan_eq = 1;
  IMND_echo_scan_mode = Constant;
  IMND_zero_offset_acq = Yes;
  IMND_max_read = IMND_max_slice = 100.0;
  if (CONFIG_user == Routine) {
  PARX_noedit(TRUE,"IMND_pulse_length,IMND_refocus_length");
  PARX_noedit(TRUE,"IMND_slice_length");
  PARX_noedit(TRUE,"IMND_imag_shape_enum,IMND_s1_thick_hz");
  IMND_slice_length = 2000.0;
  IMND_imag_shape_enum = sinc3;
  IMND_s1_thick_hz = 2260;
} else {
  PARX_noedit(FALSE,"IMND_pulse_length,IMND_refocus_length");
  PARX_noedit(FALSE,"IMND_slice_length");
  PARX_noedit(FALSE,"IMND_imag_shape_enum,IMND_s1_thick_hz");
}
  IMND_phase_encoding_mode_1 = Linear;
  IMND_phase_start_1 = -1;
  IMND_2d_phase_enc_relations();
  GO_disp_update = GS_disp_update = Each_PE_Step;
  GS_steady_state = Yes;
  spin_echo = False:
  FLAG_pulse_rel = FLAG_nucleus_rel = 1;
}
```

- 25 -

```
void SetUpMQF()
{
/*------------------------------------------------------------*
 * Last Modified:
 *------------------------------------------------------------*/ int i;
  double min_trim_dur,min_slice_dur,trim_dur,phase_dur,amp_enable;
  double trim[1],rep_time,rise_time,slice,pulse,refocus,acq_time;
  double min_evol,var_time,min_cre_1,min_cre_2,min_creation;
  double half_tau,min_tau,min_tau_1,min_tau_2,min_tau_3,min_tau_4;
  double bal_delay_1,bal_delay_2,bal_delay_3,bal_delay_4,min_rep;

IMND_nucleus_relations();
  IMND_imag_shape_relations();
  strcpy(TPQQ[0].name,IMND_imag_shape);
  strcpy(TPQQ[1].name,"bp32");

if (CONFIG_user == Research) {
     if (IMND_slice_length < 500.0) {
     IMND_slice_length = 500.0;
     PARX_sprintf("Slice sel. length must be >= %.2f usec\n",
     IMND_slice_length);
}
  if (IMND_slice_length > 10000.0) {
     IMND_slice_length = 10000.0;
     PARX_sprintf("Slice sel. length must be <= %.2f usec\n",
     IMND_slice_length);

}
  if (IMND_pulse_length < 50.0) {
     IMND_pulse_length = 50.0;
     PARX_sprintf("Excitation pulse length must be >= %.2f usec\n",
     IMND_pulse_length);

}
  if (IMND_pulse_length > 1000.0) {
     IMND_pulse_length = 1000.0;
     PARX_sprintf("Excitation pulse length must be <= %.2f usec\n",
     IMND_pulse_length);

}
  if (IMND_refocus_length < 50.0) {
     IMND_refocus_length = 50.0;
     PARX_sprintf("Refocussing pulse length must be >=%.2f usec\n",
     IMND_refocus_length);

}
  if (IMND_refocus_length > 1000.0) {
     IMND_refocus_length = 1000.0;
     PARX_sprintf("Refocussing pulse length must be <=%.2f usec\n",
     IMND_refocus_length);

}
}
  else IMND_slice_length = 2000.0;
```

```
  amp_enable = CONFIG_amplifier_enable * 1.0e-3;
  slice = IMND_slice_length * 1.0e-3;
  pulse = IMND_pulse_length * 1.0e-3;
  refocus = IMND_refocus_length * 1.0e-3;
  D[4] = ( rise_time = PREEMP_rise_time * 1.0e-3 ) * 1.0e-3;
  IMND_DW_time = nearest_int(1.0e2 / (2.0e-6 * IMND_sw_h)) / 1.0e2;
  acq_time = IMND_acq_time
    = IMND_DW_time * IMND_matrix[0] * 2.0e-3 * IMND_read_ext;

IMND_fov[0] = MAX_OF(IMND_fov[0],0.1);

min_trim_dur = rise_time + 0.002;
min_slice_dur = 0.5*(slice + rise_time);
trim_dur = MAX_OF(min_trim_dur,min_slice_dur);
D[6] = (trim_dur - rise_time)*1.0e-3;
phase_dur = 0.5*acq_time;
D[9] = (phase_dur - rise_time)*1.0e-3;

min_evol = pulse + refocus + 2.0*amp_enable;
IMND_evolution_time = MAX_OF(min_evol,IMND_evolution_time);
D[14] = 0.5*(IMND_evolution_time - (pulse + refocus))*1.0e-3;

IMND_variable_time = MIN_OF(IMND_variable_time,100.0);
IMND_variable_time = MAX_OF(IMND_variable_time,0.002);
var_time = IMND_variable_time;
D[12] = var_time * 1.0e-3;

min_tau_1 = 0.5*(slice + refocus) + var_time + rise_time +
    amp_enable + 0.002;
min_tau_2 = 0.5*(refocus + pulse) + var_time + trim_dur +
    amp_enable + rise_time + 0.002;
half_tau = MAX_OF(min_tau_1,min_tau_2);
min_cre_1 = 2.0 * half_tau;

min_tau_3 = 0.5*(pulse + refocus) + phase_dur + rise_time +
    var_time + amp_enable + 0.002;
min_tau_4 = 0.5*(acq_time + refocus) + 2.0*rise_time +
    var_time + 0.002;
half_tau = MAX_OF(min_tau_3,min_tau_4);
min_cre_2 = 2.0 * half_tau;

min_creation = MAX_OF(min_cre_1,min_cre_2);
IMND_creation_time = MAX_OF(IMND_creation_time,min_creation);
half_tau = 0.5*IMND_creation_time;

bal_delay_1 = half_tau - (0.5*(slice + refocus) + var_time +
    rise_time + amp_enable);
D[5] = bal_delay_1 * 1.0e-3;

bal_delay_2 = half_tau - (0.5*(pulse +refocus) + var_time +
    trim_dur + rise_time + amp_enable);
D[7] = bal_delay_2 * 1.0e-3;

bal_delay_3 = half_tau - (0.5*(pulse + refocus) + var_time +
    phase_dur + rise_time + amp_enable);
D[10] = bal_delay_3 * 1.0e-3;

bal_delay_4 = half_tau - (0.5*(acq_time + refocus) + var_time +
    2.0*rise_time);
D[11] = bal_delay_4 * 1.0e-3;
```

```
IMND_2d_relations();
P[0] = IMND_slice_length;
P[1] = IMND_pulse_length;
P[2] = IMND_refocus_length;
PARX_call_rels("P");

trim[0] = 100.0;
copy_trim(trim);

min_rep = (2.0*IMND_creation_time + IMND_evolution_time +
    0.5*(slice + acq_time) + 2.0*rise_time + 5.002);
if (IMND_trigger_enable) min_rep += IMND_trigger_delay + 0.01;
min_rep *= 1.0e-3;
IMND_rep_time = MAX_OF(IMND_rep_time,min_rep);
min_rep = (2.0*IMND_creation_time + IMND_evolution_time +
    0.5*(slice + acq_time) + 2.0*rise_time + 5.0);
if (IMND_trigger_enable) min_rep += IMND_trigger_delay + 0.01;
min_rep *= 1.0e-3;
D[20] = IMND_rep_delay = IMND_rep_time - min_rep;
i = IMND_rep_time * IMND_n_averages * IMND_matrix[1];
sprintf(IMND_total_time,"%dh%dm%ds",i/3600,(i%3600)/60,i%60);
}
void SetAcqMQF()
{
/*_____*
 * Last Modified:
 *_____*/ int i;

IMND_2d_acq_pars_set();
    IMND_imag_acq_pars_set();
    IMND_grad_matrix_gen();

i = IMND_rep_time * IMND_n_averages * IMND_matrix[1];
 sprintf(IMND_total_time,"%dh%dm%ds",i/3600,(i%3600)/60,i%60);
}
```

We claim:

1. A method for acquiring tomographic magnetic resonance data from a sample comprising applying a phase-cycled radio frequency pulse sequence to the sample, which radio frequency pulse sequence implements a multiple-quantum coherence filter, thereby selecting a multiple-quantum coherence, wherein the radio frequency pulses are tuned to a Larmor frequency of the selected nuclei, and each radio frequency pulse of the sequence has a flip angle relative to a slice-selection axis and a phase angle relative to a readout axis which is perpendicular to the slice-selection axis, wherein the radio frequency pulses have phase angles which are phase-cycled according to a pattern which simultaneously selects both an echo and antiecho signal component of the selected multiple-quantum coherence, thereby producing an output signal proportional to the sum of both the echo and antiecho signal components.

2. The method for acquiring tomographic magnetic resonance data according to claim 1, further comprising:
 a) applying a uniform magnetic field along a slice-selection axis of the sample, thereby causing alignment of a plurality of selected nuclei within the sample in response to said uniform magnetic field,
 b) applying a magnetic gradient pulse sequence to the sample in timewise coordination with the radio frequency pulse sequence, wherein the magnetic gradient pulse sequence encodes positional information in the output signal, and
 c) detecting the output signal.

3. The method for acquiring tomographic magnetic resonance data according to claim 2, wherein said radio frequency pulse sequence has in sequence: i) a preparation period of time $t_p$ extending from a time zero $t_o$, during which the selected nuclei exhibit single-quantum coherence, ii) an evolution period of time $t_e$, during which the selected nuclei exhibit the selected multiple-quantum coherence, and iii) a detection period of time $t_d$, during which the selected nuclei exhibit single-quantum coherence and the output signal is detected.

4. The method for acquiring tomographic magnetic resonance data according to claim 3, wherein said evolution period of said radio frequency pulse sequence comprises:
 a) an evolution period first 90° flip angle radio frequency pulse timewise centered at $t_p$ which converts the selected nuclei from single-quantum coherence to the selected multiple-quantum coherence,
 b) an evolution period second 90° flip angle radio frequency timewise centered at $t_p+t_e$, which converts the selected nuclei from multiple-quantum coherence back to single-quantum coherence.

5. The method for acquiring tomographic magnetic resonance data according to claim 4, wherein said evolution period first 90° flip angle radio frequency pulse has a phase angle $\phi_3$ and said evolution period second 90° flip angle radio frequency pulse has a phase angle $\phi_5$, wherein $$\phi_E = -\phi_3 + \phi_5$$

where
 $\phi_E$=the collective phases of the evolution period radio frequency pulses.

6. The method for acquiring tomographic magnetic resonance data according to claim 3, wherein said phase-cycled radio frequency pulse sequence comprises an evolution period 180° flip angle radio frequency refocusing pulse.

7. The method for acquiring tomographic magnetic resonance data according to claim 6, wherein said evolution period of said radio frequency pulse sequence comprises:
 a) an evolution period first 90° flip angle radio frequency pulse timewise centered at $t_p$ which converts the selected nuclei from single-quantum coherence to the selected multiple-quantum coherence,
 b) the evolution period 180° flip angle radio frequency refocusing pulse timewise centered at $t_p+\frac{1}{2}t_e$, which prevents signal deterioration due to magnetic field inhomogeneity of the sample, and
 c) an evolution period second 90° flip angle radio frequency pulse timewise centered at $t_p+t_e$, which converts the selected nuclei from multiple-quantum coherence back to single-quantum coherence.

8. The method for acquiring tomographic magnetic resonance data according to claim 7, wherein said evolution period first 90° flip angle radio frequency pulse has a phase angle $\phi_3$, said evolution period 180° flip angle refocusing pulse has a phase angle $\phi_4$, and said evolution period second 90° flip angle radio frequency pulse has a phase angle $\phi_5$ wherein $$\phi_E = \phi_3 - 2\phi_4 + \phi_5,$$

where
 $\phi_E$=the collective phases of the evolution period radio frequency pulses.

9. The method for acquiring tomographic data according to claim 8, wherein the radio frequency pulse sequence further comprises:
 a) a preparation period 90° flip angle radio frequency slice selection pulse timewise centered at time zero which selects a slab of the sample, which slab is a plane perpendicular to the slice-selection axis,
 b) a preparation period 180° flip angle radio frequency refocusing pulse timewise centered at time $\frac{1}{2}t_p$ which compensates for any magnetic field inhomogeneity over the sample,
 c) a detection period 180° flip angle radio frequency refocusing pulse timewise centered at $t_p+t_e+\frac{1}{2}t_d$, which compensates for any magnetic field inhomogeneity over the sample.

10. The method for acquiring tomographic data according to claim 9, wherein the preparation period 90° flip angle radio frequency slice selection pulse has a phase angle $\phi_1$, said preparation period 180° flip angle radio frequency refocusing pulse has a phase angle $\phi_2$, and said detection period 180° flip angle radio refocusing pulse has a phase angle $\phi_6$, wherein $$\phi_P = \phi_1 - 2\phi_2 + \phi_3$$

and $$\Phi = \phi_P - m\phi_E + \phi_5 + 2\phi_6 + \phi_R$$

where,
 $\phi_P$=the collective radio frequency pulse phases involved in the evolution time,
 $\phi_R$=the phase of the receiver,
 $\Phi$=the phase of the detected signal, and
 m=an integer corresponding to the selected multiple-quantum transition.

11. The method for acquiring tomographic data according to claim 10, wherein m=±2.

12. The method for acquiring tomographic data according to claim 10, wherein m=±3.

13. The method for acquiring tomographic magnetic resonance data according to claim 11, wherein $\phi_1 = (n/2)\pi$,
$\phi_2 = [n/2 + \text{int}(n/4)]\pi$,
$\phi_3 = (n/2)\pi$,
$\phi_4 = 0$,
$\phi_5 = 0$,
$\phi_6 = 0$, and
$\phi_R = n\pi$, wherein int(n/4) represents the integer part of the variable n/4 and n is from 0 to N−1 where N is a multiple of 8.

14. The method for acquiring tomographic magnetic resonance data according to claim 12, wherein $\phi_2 = (n/3)\pi$,
$\phi_2 = [n/3 + \text{int}(n/6)]\pi$,
$\phi_3 = (n/3 + \frac{1}{2})\pi$,
$\phi_4 0$,
$\phi_5 (\frac{1}{6})\pi$,
$\phi_6 0$, and
$\phi_R = [n + \text{int}(n/6)]\pi$, where int(n/6) represents the integer part of the variable n/6 and n is from 0 to N−1 where N is a multiple of 12.

15. The method for acquiring tomographic magnetic resonance data according to claim 10, wherein the selected nuclei are $Na^{23}$.

16. The method for acquiring tomographic magnetic resonance data according to claim 15, wherein the sample is an animal.

17. The method for acquiring tomographic magnetic resonance data according to claim 16, wherein the sample is a human being.

18. The method for acquiring tomographic magnetic resonance data according to claim 17, wherein the output signal is detected by measuring an inductive current in a radio frequency coil.

19. The method for acquiring tomographic magnetic resonance data according to claim 10, wherein the magnetic gradient pulse sequence comprises:

a slice-selection magnetic gradient pulse applied along the slice-selection axis for a length of time at least overlapping the application of the preparation period 90° flip angle slice-selection radio frequency pulse, a slice-selection compensation magnetic gradient pulse applied along the slice-selection axis after the preparation period 180° flip angle radio frequency refocusing pulse and before the evolution period first 90° flip angle radio frequency pulse, wherein the slice-selection compensation magnetic gradient pulse has a total time/amplitude product equal to a portion of the time/amplitude product of the slice-selection magnetic gradient pulse which occurs after $t_o$, a first phase-encoding magnetic gradient pulse applied after the evolution period second 90° flip angle radio frequency pulse and before the evolution period 180° flip angle radio frequency refocusing pulse along a phase-encoding axis orthogonal to both the slice-selection axis and the readout axes, a readout compensation magnetic gradient pulse applied along the readout axis in synchrony with the phase-encoding magnetic gradient pulse, and a readout magnetic gradient pulse applied along the readout axis after the evolution period 180° flip angle radio frequency refocusing pulse, wherein the readout magnetic gradient pulse has a portion of its time/amplitude product before the time $t_p + t_e + t_d$ which is equal to a total time/amplitude product of the readout compensation magnetic gradient pulse.

20. The method for acquiring tomographic magnetic resonance data according to claim 19, wherein the magnetic gradient pulse sequence further comprises a second phase-encoding magnetic gradient pulse applied along the slice-selection axis in synchrony with the phase-encoding magnetic gradient pulse.

21. A magnetic resonance imagining system which comprises:

a) magnet apparatus for generating a uniform magnetic field along a slice-selection axis of a sample, b) a radio frequency coil capable of generating radio frequency pulses tuned to selected frequencies, c) magnetic gradient coils capable of applying magnetic gradient pulses to the sample along a slice-selection axis, a readout axis and a phase-encoding axis, and d) a computer programmed to:

(1) apply a phase-cycled radio frequency pulse sequence to the sample, which radio frequency pulse sequence implements a multiple-quantum filter, thereby selecting a multiple-quantum coherence, wherein the radio frequency pulses are tuned to a Larmor frequency of the selected nuclei, and each radio frequency pulse of the sequence has a flip angle relative to a slice-selection axis and a phase angle relative to a readout axis which is perpendicular to the slice-selection axis, wherein the radio frequency pulses have phase angles which are phase-cycled according to a relationship which simultaneously selects both an echo and antiecho signal component of the selected multiple-quantum coherence, thereby producing an output signal proportional to the sum of both the echo and antiecho signal components, (2) apply a magnetic gradient pulse sequence via the magnetic gradient coils to the sample in timewise coordination with the radio frequency pulse sequence, wherein the magnetic gradient pulse sequence encodes positional information in the output signal, and (3) detect the output signal by measuring a current induced in the radio frequency coil.

* * * * *

UNITED STATES PATENT AND TRADEMARK OFFICE
CERTIFICATE OF CORRECTION

PATENT NO. : 5,818,230

DATED : October 6, 1998

INVENTOR(S) : Katz et al.

It is certified that error appears in the above-identified patent and that said Letters Patent is hereby corrected as shown below:

Col. 23, line 56: "$\phi_E +-\phi_3+\phi_5$" should read -- $\phi_E = -\phi + \phi_5$ --

Col. 25, line 7: "$\phi_4=O$," should read -- $\phi_4 = 0$, --

Col. 25, line 8: "$\phi_5=O$," should read -- $\phi_5 = 0$, --

Col. 25, line 9: "$\phi_6=O$," should read -- $\phi_6 = 0$, --

Col. 25, line 15: "$\phi_2=(n/3)\pi$," should read -- $\phi_1 = (n/3)\pi$, --

Col. 25, line 18: "$\phi_4 O$," should read -- $\phi_4 = 0$, --

Col. 25, line 19: "$\phi_5(1/6)\pi$," should read -- $\phi_5 = (1/6)\pi$, --

Col. 25, line 20: "$\phi_6 O$," should read -- $\phi_6 = 0$, --

Col. 25, line 27: "$Na^{23}$" should read -- $^{23}Na$ --

Col. 26, line 21: "imagining" should read -- imaging --

Col. 2, line 4: "$Na^{23}$" should read -- $^{23}Na$ --

Col. 2, line 10: "$Na^{23}$" should read -- $^{23}Na$ --

UNITED STATES PATENT AND TRADEMARK OFFICE
CERTIFICATE OF CORRECTION

PATENT NO. : 5,818,230

DATED : October 6, 1998

INVENTOR(S) : Katz et al.

It is certified that error appears in the above-identified patent and that said Letters Patent is hereby corrected as shown below:

Col. 5, line 37: "$t_p + t_e$." should read -- $t_p + \frac{1}{2} t_e$. --

Col. 6, line 43: "$\phi_4 = O,$" should read -- $\phi_4 = 0,$ --

Col. 6, line 44: "$\phi_5 = O,$" should read -- $\phi_5 = 0,$ --

Col. 6, line 45: "$\phi_6 = O,$" should read -- $\phi_6 = 0,$ --

Col. 6, line 58: "$\phi_4 = O,$" should read -- $\phi_4 = 0,$ --

Col. 6, line 60: "$\phi_6 = O,$" should read -- $\phi_6 = 0,$ --

UNITED STATES PATENT AND TRADEMARK OFFICE
CERTIFICATE OF CORRECTION

PATENT NO. : 5,818,230
DATED : October 6, 1998
INVENTOR(S) : Katz, et al.

It is certified that error appears in the above-identified patent and that said Letters Patent is hereby corrected as shown below:

Col. 9, line 32: "$Na^{23}$" should read -- $^{23}Na$ --

Col. 9, line 54: "$Na^{23}$" should read -- $^{23}Na$ --

Col. 10, line 16: "$Na^{23}$" should read -- $^{23}Na$ --

Signed and Sealed this

Fourteenth Day of March, 2000

Attest:

Q. TODD DICKINSON

Attesting Officer

Commissioner of Patents and Trademarks